(12) United States Patent
Musale et al.

(10) Patent No.: US 7,299,677 B2
(45) Date of Patent: Nov. 27, 2007

(54) VEHICLE OCCUPANT ANALYSIS MODEL FOR VEHICLE IMPACTS

(75) Inventors: Gopal Musale, Troy, MI (US); Reza Keshtkar, Troy, MI (US)

(73) Assignee: Chrysler LLC, Auburn Hills, MI (US)

( * ) Notice: Subject to any disclaimer, the term of this patent is extended or adjusted under 35 U.S.C. 154(b) by 85 days.

(21) Appl. No.: 11/296,166

(22) Filed: Dec. 7, 2005

(65) Prior Publication Data

US 2007/0143087 A1 Jun. 21, 2007

(51) Int. Cl.
*G01M 7/00* (2006.01)
(52) U.S. Cl. .................................... 73/12.01
(58) Field of Classification Search ..... 73/12.01–12.09
See application file for complete search history.

(56) References Cited

U.S. PATENT DOCUMENTS

| | | | | |
|---|---|---|---|---|
| 4,161,874 A | * | 7/1979 | Specker et al. | 73/12.01 |
| 5,483,845 A | * | 1/1996 | Stein et al. | 73/865.3 |
| 5,485,758 A | * | 1/1996 | Brown et al. | 73/865.8 |
| 6,522,998 B1 | * | 2/2003 | Mazur et al. | 703/8 |
| 2002/0157450 A1 | * | 10/2002 | Hutchenreuther et al. | 73/11.04 |
| 2006/0095235 A1 | * | 5/2006 | Furtado et al. | 703/1 |

OTHER PUBLICATIONS

Tools for Occupant Protection Analysis, Paul M. A. Slaats, et al., SAE Technical Paper 2001-01-2725, Nov. 12-14, 2001.
LS-Dyna 3D Interface Component Analysis to Predict FMVSS 208 Occupant Responses, Venkatesh Babu, et al., SAE Technical Paper 2003-01-1294, Mar. 3-6, 2003.
Versatile Occupant Analysis Model (V.O.A.M) for Frontal Impacts Using LS-DYNA and MADYMO, Gopal Musale, et al., SAE Technical Paper 2005-01-1000, Apr. 11-14, 2005.

* cited by examiner

*Primary Examiner*—Max Noori
(74) *Attorney, Agent, or Firm*—Ralph E. Smith

(57) ABSTRACT

A method of simulating a vehicle impact that involves generating a first finite element model of the vehicle, a multi-body model, and a partial vehicle finite element model. The method also involves generating a coupled model that includes at least a portion of the multi-body model and at least a portion of the partial vehicle finite element model. Additionally, the method includes running at least one impact simulation with the coupled model to thereby identify the effects of the impact on the vehicle and/or the occupant.

15 Claims, 5 Drawing Sheets

FIG 5A
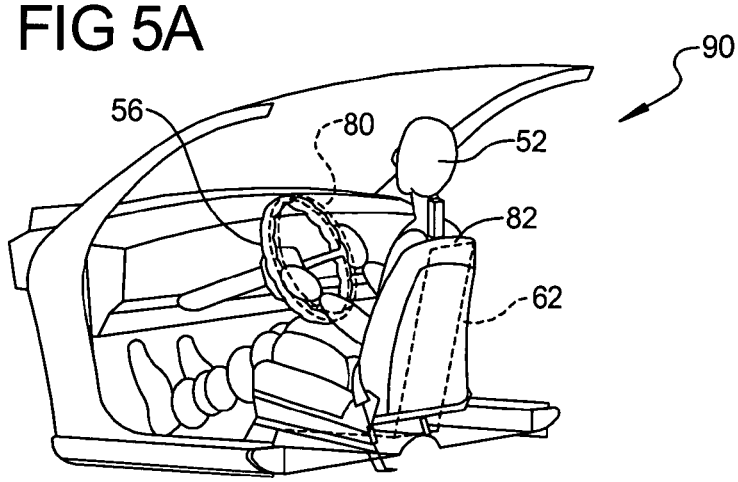
FIG 5B
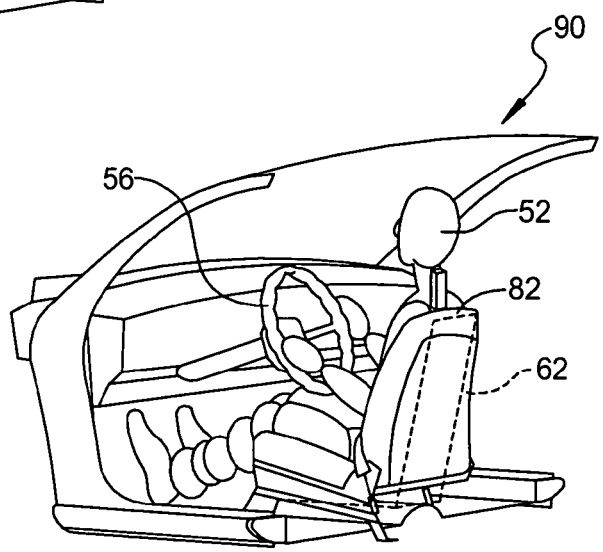
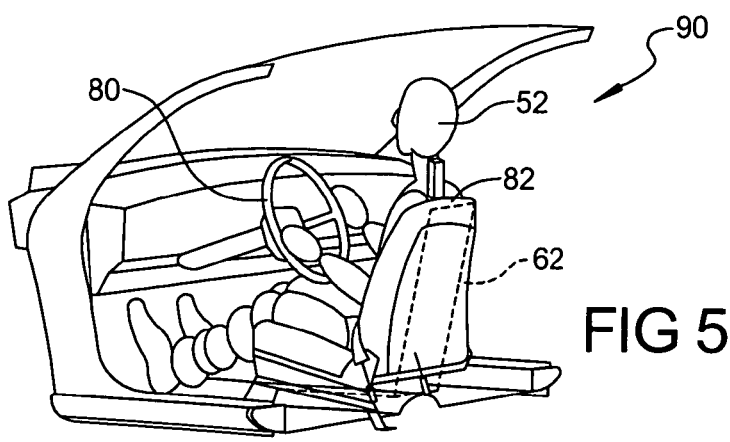
FIG 5C

VEHICLE OCCUPANT ANALYSIS MODEL FOR VEHICLE IMPACTS

FIELD OF THE INVENTION

The present invention relates to vehicular impact modeling and, more particularly, to a vehicle occupant analysis model for a vehicle impact.

BACKGROUND OF THE INVENTION

Computer models capable of simulating the effects of a vehicle impact are often used to analyze the effects on an occupant during impact, to predict how a component will perform during impact, and otherwise.

However, current vehicular impact modeling techniques suffer from certain disadvantages. For instance, these models are often very complex, and running impact simulations can take a significant amount of time. Also, it may be desirable to analyze certain scenarios, but the complexity of the model may inhibit the user's ability of creating the scenario. Furthermore, conventional modeling techniques include inputting an initial velocity to the occupant and interior components. However, this method may not produce accurate results, especially when the impact causes extremely high accelerations and/or the impact causes significant lateral displacements of the vehicle.

Therefore, there remains a need in the art for a modeling technique that is less time consuming. There also remains a need in the art for a modeling technique that enables a user to more easily analyze certain impact scenarios. Furthermore, there remains a need in the art for a modeling technique that produces more accurate results.

SUMMARY OF THE INVENTION

The present invention overcomes the disadvantages of the prior art in a method of simulating a vehicle impact. The method includes the step of generating a first finite element model of the vehicle. The first finite element model includes a plurality of boundary points on the vehicle. The method also includes the step of running at least one vehicle impact simulation on the first finite element model to generate impact data at each of the boundary points of the first finite element model. The method further includes the step of generating a multi-body model that includes a vehicle occupant and at least one vehicle component. The multi-body model includes a plurality of boundary points that coincide with the boundary points included in the first finite element model. In addition, the method involves running at least one vehicle impact simulation on the multi-body model by inputting impact data generated at each of the boundary points of the first finite element model into the boundary points of the multi-body model. Also, the method includes generating a partial vehicle finite element model that includes a plurality of master nodes and a plurality of slave nodes. By inputting boundary conditions at the master nodes, output data at the slave nodes is generated. The method further includes generating a coupled model that includes at least a portion of the multi-body model and at least a portion of the partial vehicle finite element model. Additionally, the method includes running at least one impact simulation with the coupled model to thereby identify the effects of the impact on the vehicle and/or the occupant.

In another aspect, the present invention is a method of simulating a vehicle impact. The method involves creating a multi-body model of a plurality of systems. The systems are representative of an occupant and at least one component of the vehicle, and each system is located relative to a master joint. The method also involves providing an input at the master joint and analyzing the effects on at least one system of the multi-body model due to the input provided at the master joint.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 5A, 5B and 5C are perspective views of a coupled model that can be used in connection with the present invention.

DETAILED DESCRIPTION OF THE PREFERRED EMBODIMENTS

The following description of the preferred embodiment(s) is merely exemplary in nature and is in no way intended to limit the invention, its application, or uses.

Figure 1:
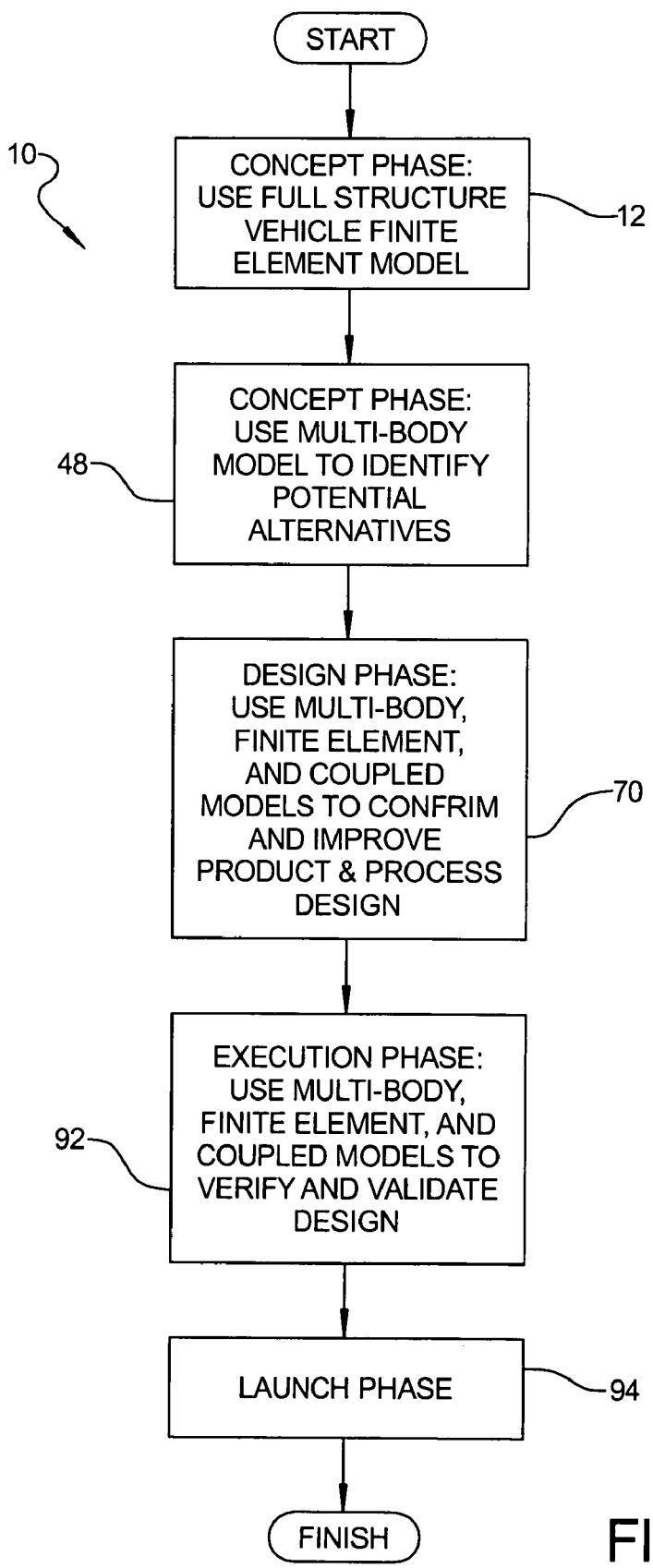
FIG. 1 is a flowchart representing a method of the present invention.

Referring now to FIG. 1, a method 10 of designing a vehicle by modeling frontal impacts is illustrated. More specifically, the method 10 involves simulating vehicle impacts with a series of models to understand the effects of the impacts on the occupants and the vehicle. As will be discussed, finite element models are utilized during the method 10. As is commonly known, finite element models are those that represent objects with multiple, simplified representations of discrete regions (i.e., finite elements) linked by nodes. To analyze a vehicle impact using finite element analysis, vehicle impact loads are inputted to the finite element model, and resultant stresses, displacements, and other effects on the structure are obtained. In one embodiment, LS-DYNA software from Livermore Software Technology Corporation is used during the method 10 to generate the finite element models and to simulate vehicle impacts. Multi-body models are also used during the method 10, as will be discussed. As is commonly known, multi-body models include systems of rigid bodies interconnected by kinematic joints. The bodies can be planes, cylinders, ellipsoids, or other types. A joint can restrict the relative motion of the two bodies it interconnects. In one embodiment, MADYMO software developed by TNO Road-Vehicles Research Institute is used to generate the multi-body models and to simulate vehicle impacts during the method 10. The method 10 further involves the use of coupled models. As is commonly known, the coupled models include components from the finite element models and components from the multi-body models.

Figure 2:
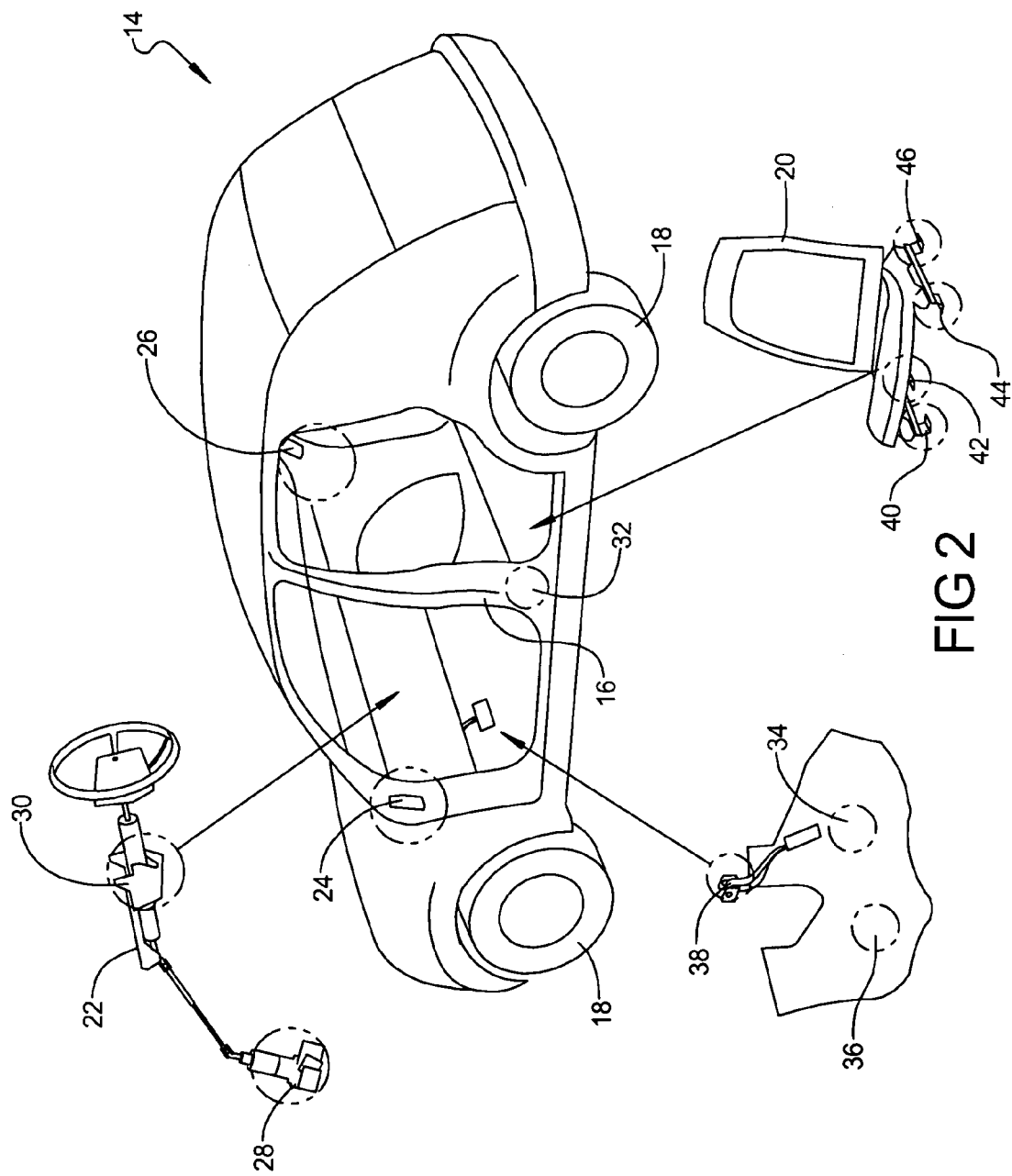
FIG. 2 is an exploded perspective view of a full structure vehicle finite element model that can be used in connection with the present invention.

The method 10 begins in step 12, in the concept phase of the vehicle development. Step 12 specifically involves generating a full structural vehicle finite element model 14, such as the model shown in FIG. 2. In the embodiment shown, the full structural model 14 includes the vehicle body 16, the tires 18, the seats 20, and the steering column 22. It should be appreciated that the vehicle doors can be included with the full structural model 14, although they are not shown in FIG. 2 for clarity. It should also be appreciated that the full structural model 14 could include any number of components of the vehicle without departing from the scope of the invention. It may be preferable, however, if the full structural model 14 included as many components as needed to accurately represent the behavior of the vehicle's structure during impact.

In one embodiment, at least one and, preferably, a plurality of boundary points are selected on the full structural model 14. For instance, the selected boundary points in the embodiment shown are located at the left hinge pillar 24, the right hinge pillar 26, the steering gear 28, the middle of the steering column 30, the left mid sill 32, the inboard side of the toe pan 34, the outboard side of the toe pan 36, the base of the gas pedal 38, the forward inboard attachment bracket of the seat 40, the rearward inboard attachment bracket of the seat 42, the forward outboard attachment bracket of the seat 44, and the rearward outboard attachment bracket of the seat 46. It will be appreciated by those having ordinary skill in the art that there could be any number of selected boundary points, and the boundary points could be selected at any location without departing from the scope of the invention.

Next, at least one simulation of a vehicle impact is run on the full structural model 14. These could be any number of simulations, and the simulations could be of any type of frontal test mode including, but not limited to flat front barrier simulations, left or right angular barrier simulations, and offset barrier simulations, each of which are well known in the art. By running these simulations, loads on the vehicle's components, displacement of the components due to the impact, and/or other data is generated. In particular, impact data at each of the selected boundary points 24, 26, 28, 30, 32, 34, 36, 38, 40, 42, 44, 46 is generated. The impact data at each of the boundary points 24, 26, 28, 30, 32, 34, 36, 38, 40, 42, 44, 46 forms the basis of further simulations as will be discussed.

Figure 3:
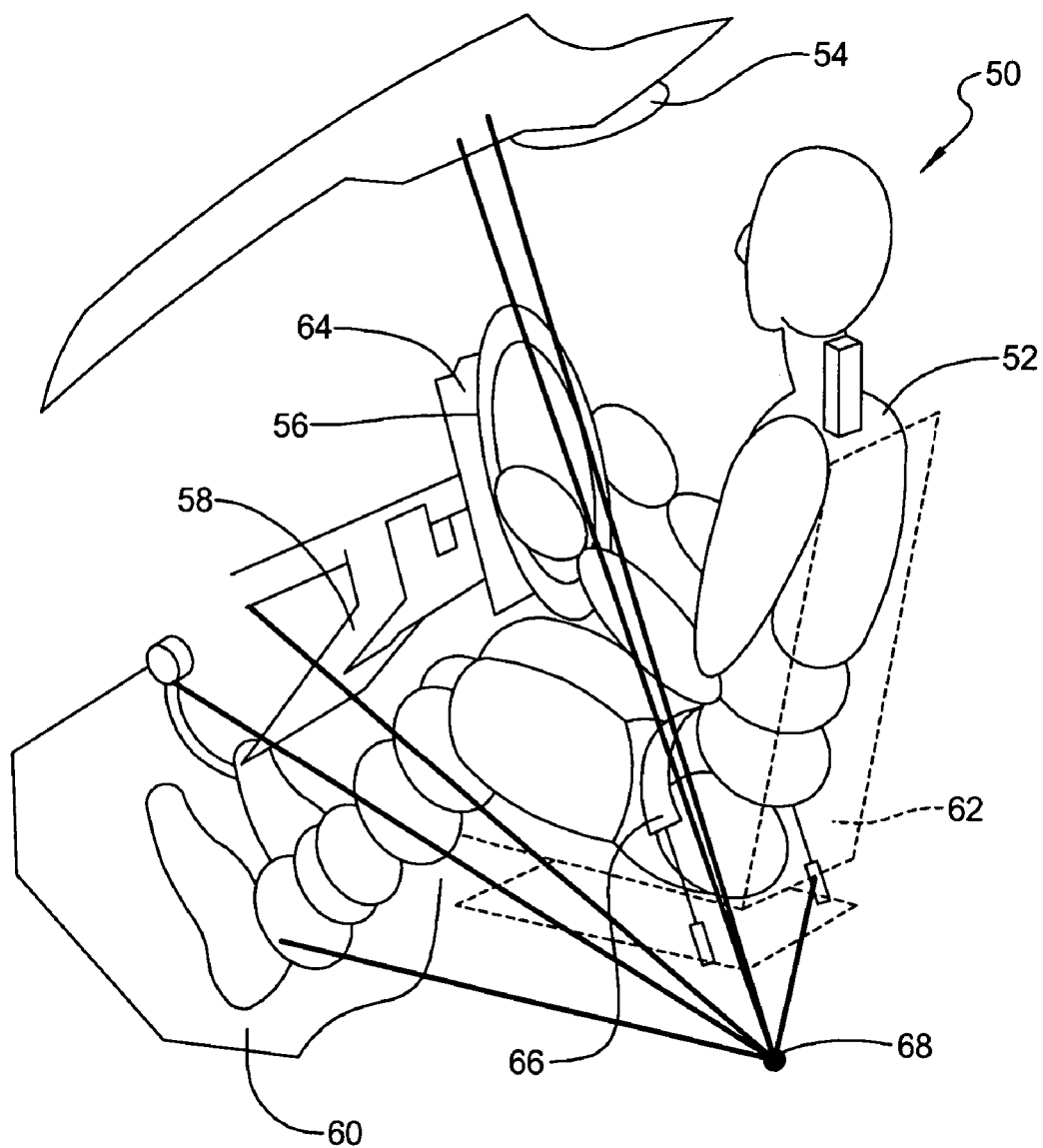
FIG. 3 is an exploded perspective view of a partial vehicle multi-body model that can be used in connection with the present invention.

Referring back to FIG. 1, the method 10 continues in step 48. In this step 48, a multi-body model 50 is generated, such as the model 50 shown in FIG. 3. The multi-body model 50 includes a plurality of systems, including a system representing an occupant 52 and at least one system representing a component, such as the passenger compartment of the vehicle. In the embodiment shown, the multi-body model 50 includes an occupant 52, an overhead pillar 54, a steering column 56, a knee blocker 58, a toe pan 60, and a seat 62. Also, in the embodiment shown, the multi-body model 50 includes an airbag 64 and a seatbelt assembly 66 represented in finite elements for more accuracy. It should be appreciated that the multi-body model 50 could include any number of systems without departing from the scope of the invention. The dimensions and position of the objects in the multi-body model 50 correspond to the dimensions and position of the objects in the full structural model 14 shown in FIG. 2 and described above.

A plurality of boundary points are selected on the multi-body model 50. In one embodiment, the boundary points selected coincide with the boundary points 24, 26, 28, 30, 32, 34, 36, 38, 40, 42, 44, 46 selected in the full structural model 14 of FIG. 2.

Also, in the embodiment shown, each system is located relative to a master joint 68. More specifically, when building the multi-body model 50, the first body of every system is the master joint 68, and each system is positioned relative to the master joint 68. In the embodiment shown, the master joint 68 is located so as to be in the same approximate location as the left mid sill of the vehicle. As will be discussed in greater detail, global vehicle displacements are inputted at the master joint 68. The master joint 68 is a free joint in the embodiment shown such that linear displacements along the X, Y, and Z axes and yaw, pitch, and roll can each be inputted to the multi-body model 50.

Thus, as shown FIG. 1, step 48 of the method 10 involves utilizing the multi-body model 50 to identify potential design alternatives. For instance, the multi-body model 50 can be used to run a plurality of impact simulations. More specifically, the impact data collected in step 12 of the method (i.e., accelerations and/or displacements of the boundary points 24, 26, 28, 30, 32, 34, 36, 38, 40, 42, 44, 46 of the full structural model 14) is used as input for running simulations with the multi-body model 50. Several simulations can be run, and each simulation can vary the impact mode, the occupant type (e.g., $50^{th}$ percentile belted and unbelted occupant simulations, $5^{th}$ percentile belted and unbelted occupant), and/or the configuration of the occupant restraints (e.g., airbag inflator pressure, airbag vent size, airbag firing time, the seatbelt retractor force, and seatbelt pretensioner type). By running these simulations, several alternatives for the interior and restraints are identified.

In one embodiment, the user inputs acceleration data, rather than initial velocity inputs, when running impact simulations with the multi-body model 50. For example, in one embodiment, the user inputs acceleration along the X-axis to the occupant 52. The acceleration data is the deceleration of the vehicle from the moment of impact until the vehicle comes to rest in one embodiment. As such, the simulations run using the multi-body model 50 can be more accurate, especially when the impact causes extremely high accelerations and/or significant lateral displacement of the vehicle.

It should be appreciated that these simulations can be run fairly quickly. For instance, in one embodiment, the simulations can be run in approximately forty minutes each. This is because the multi-body model 50 is relatively simple and includes only the relevant structure of the interior of the vehicle. It should also be appreciated that the simulations are sufficiently accurate because the inputs are generated using the full structural model 14 in step 12 of the method 10. Accordingly, the interior and occupant restraints of the vehicle can be improved quickly and accurately using the multi-body model 50.

Referring back to FIG. 1, the method 10 continues in step 70 by entering into a design phase, in which the vehicle design is confirmed and further improved. More specifically, a finite-element partial vehicle model 72 is generated, such as the embodiment shown in FIG. 4. In the embodiment shown, the finite-element partial vehicle model 72 includes a plurality of components, such as a hinge pillar 74, a windshield 76, an instrument panel 78, a steering column 80, and a seat 82.

Boundary points are selected on the partial vehicle model 72 by attaching a set of master nodes to an empty rigid part.

The remaining nodes in the part are considered slave nodes. More specifically, boundary conditions are input at the master nodes to obtain output at the slave node. For instance, the hinge pillar 74 includes a first master node 84 and a second master node 86. The remaining nodes on the hinge pillar 74 are considered slave nodes. As such, simulations can be run to identify the load on the hinge pillar 74, the intrusion of the hinge pillar 74, or other impact effect relatively quickly because input need only be applied at the first and second master nodes 84, 86. The seat 82 also includes master nodes, for instance, at each attachment bracket 88*a*, 88*b*, 88*c*, 88*d*.

It should be appreciated that the impact scenario could be altered quickly using the partial vehicle model 72. For instance, if the user wishes to see the effects of a predetermined amount of intrusion of the hinge pillar 74, the desired intrusion can be input directly into the partial vehicle model 72 without having to utilize the full structural vehicle model 14. Thus, the modeling method 10 provides versatility for running impact simulations.

Figure 4:
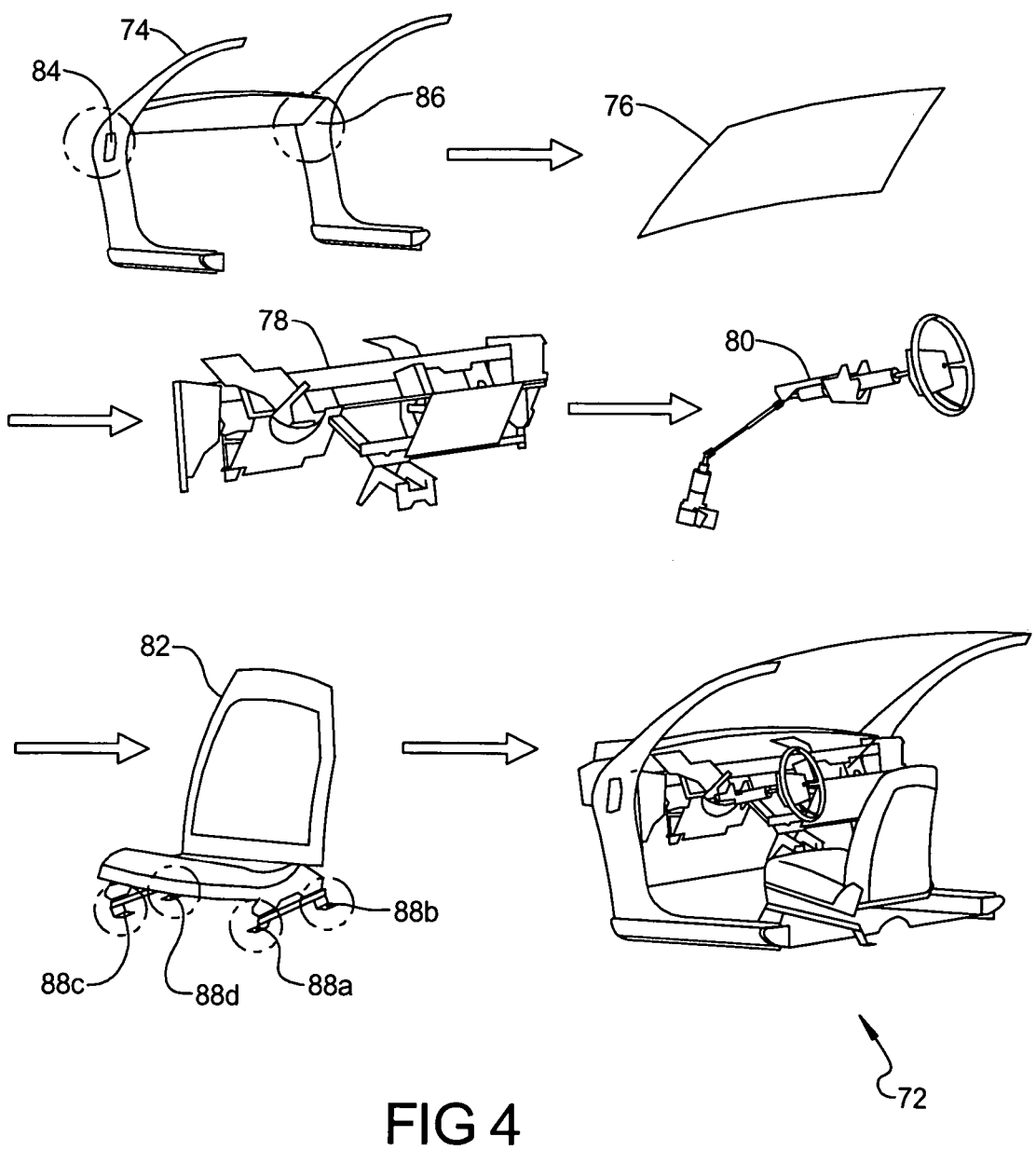
FIG. 4 is an exploded perspective view of a partial vehicle finite element model that can be used in connection with the present invention.

Step 70 of the method 70 also involves generating a coupled model 90, such as the model 90 shown in FIGS. 5A, 5B and 5C. The coupled model 90 is generated using known coupling techniques and software. The coupled model 90 includes some or all of the contents of the multi-body model 50 (FIG. 3) and some or all of the components from the partial vehicle model 72 (FIG. 4). In the embodiment shown, the coupled model 90 includes redundant components. For example, in FIG. 5A, the coupled model 90 includes the steering wheel 56 from the multi-body model 50 and redundantly includes the steering wheel 80 from the partial vehicle model 72. Likewise, the coupled model 90 includes the seat 62 from the multi-body model 50 and redundantly includes the seat 82 from the partial vehicle model 72. As such, this redundancy gives the user the option of analyzing components represented as finite elements or multi-bodies. For instance, the user can analyze the interaction between the occupant 52 and the multi-body steering wheel 56 (see FIG. 5B) or between the occupant 52 and the finite element steering wheel 80 (see FIG. 5C), depending on the purpose of the simulation. In one embodiment, step 70 of the method 10 involves running simulations with the coupled model 90 to evaluate the instrument panel, the seat, the steering wheel, and the column strap.

Referring back to FIG. 1, the method 10 continues in step 92. This step is considered the execution phase of the method 10. In this step 92, the coupled model 90 is used to verify and validate the design. In one embodiment, the boundary conditions generated using the full structural model 14 in step 12 are input into the selected boundary points of the coupled model 90 to analyze the effects of impact. Global vehicle motions are input at the master joint 68. Also, acceleration data, rather than initial velocity, is input to the occupant. As such, simulations run with the coupled model 90 are more accurate.

The coupled model 90 can be "uncoupled" for analyzing only the multi-body components or the finite element components, depending on the problem being evaluated. It should be appreciated that the simulations can be run in less time because the uncoupled models are less complex. For instance, if the user wishes to run certain scenarios (such as an increased intrusion of the hinge pillar), the user can simply uncouple the finite element model and directly input the increased intrusion. Because the models can be uncoupled, the modeling method 10 is versatile, even late in the execution phase of the method 10.

Referring back to FIG. 1, the method 10 continues to step 94. In step 94, the method 10 enters a launch phase, in which the vehicle is manufactured and marketed.

In summary, the method 10 of the present invention provides an efficient means of simulating the structural, restraint, and occupant responses under different frontal impact conditions using a variety of models. Vehicle structural motions retrieved from the full structural vehicle model 14 are used as boundary point inputs for improved accuracy. The global vehicle kinematics are captured by applying the prescribed motion to the master joint 68, to which the different multi-body systems are attached. Coupling and uncoupling the models provides an accurate, quick, and versatile means of simulating and evaluating the impacts. This approach simplifies the model building process and provides an efficient means for simulating different test modes. Changes in occupant response due to varying vehicle global motions can also be evaluated more quickly. Accordingly, the method 10 provides significant time and cost savings in testing and prototype construction.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of simulating a vehicle impact comprising the steps of:

generating a first finite element model of the vehicle, wherein the first finite element model includes a plurality of boundary points on the vehicle chosen from a group consisting of a left hinge pillar, a right hinge pillar, a steering gear, a middle point on a steering column, a left mid sill, an inboard side of a toe pan, an outboard side of the toe pan, a base of a gas pedal, a forward inboard attachment bracket of a seat, a rearward inboard attachment bracket of the seat, a forward outboard attachment bracket of the seat, a rearward outboard attachment bracket of the seat, and a combination thereof;

running at least one vehicle impact simulation on the first finite element model to generate impact data at each of the boundary points of the first finite element model;

generating a multi-body model that includes a vehicle occupant and at least one vehicle component, wherein the multi-body model includes a plurality of boundary points that coincide with the boundary points included in the first finite element model;

running at least one vehicle impact simulation on the multi-body model by inputting impact data generated at each of the boundary points of the first finite element model into the boundary points of the multi-body model;

generating a partial vehicle finite element model that includes a plurality of master nodes and a plurality of slave nodes, wherein boundary conditions input at the master nodes generates output data at the slave nodes;

generating a coupled model that includes at least a portion of the multi-body model and at least a portion of the partial vehicle finite element model; and running at least one impact simulation with the coupled model to thereby identify the effects of the impact on at least one of the vehicle and the occupant of the vehicle.

2. The method of claim 1, wherein the first finite element model comprises a vehicle body, a plurality of tires, at least one seat and a steering column.

3. The model of claim 1, further comprising the steps of uncoupling the coupled model by analyzing only components of one of the multi-body model and the partial vehicle finite element model.

4. The method of claim 1, wherein the at least one vehicle component of the multi-body model comprises an overhead pillar, a steering column, a knee blocker, a toepan, at least one seat, an airbag, and a seatbelt assembly.

5. The method of claim 1, wherein multi-body model includes a plurality of systems that are each located relative to a master joint, and wherein global vehicle displacements are inputted at the master joint.

6. The method of claim 5, wherein the master joint is a free joint.

7. The method of claim 1, wherein the step of running at least one vehicle impact simulation on the multi-body model comprises inputting an initial acceleration to the multi-body model.

8. The method of claim 1, wherein the partial vehicle finite element model includes a hinge pillar, a windshield, an Instrument panel, a steering column, and at least one seat.

9. The method of claim 1, wherein the master joints included in the partial vehicle finite element model are included at a hinge pillar and an attachment bracket of a seat.

10. The method of claim 1, wherein the coupled model includes redundant components.

11. The method of claim 10, wherein the coupled model includes a steering wheel from the multi-body model and redundantly includes a steering wheel from the partial vehicle model.

12. The method of claim 10, wherein the coupled model includes a seat from the multi-body model and redundanuy includes a seat from the partial vehicle model.

13. A method of simulating a vehicle impact comprising the steps of:
   generating a first finite element model of the vehicle, wherein the first finite element model includes a plurality of boundary paints on the vehicle;
   running at least one vehicle impact simulation on the first finite element model to generate impact data at each of the boundary points of the first finite element model;
   generating a multi-body model that includes a vehicle occupant, an overhead pillar, a steering column, a knee blocker, a toe pan, at least one seat, an airbag, and a seatbelt assembly, wherein the multi-body model includes a plurality of boundary points that coincide with the boundary points included in the first finite element model;
   running at least one vehicle impact simulation on the multi-body model by inputting impact data generated at each of the boundary points of the first finite element model into the boundary points of the multi-body model;
   generating a partial vehicle finite element model that includes a plurality of master nodes and a plurality of slave nodes, wherein boundary conditions input at the master nodes generates output data at the slave nodes;
   generating a coupled model that includes at least a portion of the multi-body model and at least a portion of the partial vehicle finite element model; and
   running at least one impact simulation with the coupled model to thereby identity the effects of the impact on at least one of the vehicle and the occupant of the vehicle.

14. A method of simulating a vehicle impact comprising the steps of:
   generating a first finite element model of the vehicle, wherein the first finite element model includes a plurality of boundary points on the vehicle;
   running at least one vehicle impact simulation on the first finite element model to generate impact data at each of the boundary points of the first finite element model;
   generating a niufti-body model that includes a vehicle occupant and at least one vehicle component, wherein the multi-body model includes a plurality of boundary points that coincide with the boundary points included in the first finite element model;
   running at least one vehicle impact simulation on the multi-body model by inputting impact data generated at each of the boundary points of the first finite element model into the boundary points of the multi-body model;
   generating a partial vehicle finite element model including a hinge pillar, a windshield, an instrument panel, a steering column, and at least one seat and that includes a plurality of master nodes and a plurality of slave nodes, wherein boundary conditions input at the master nodes generates output data at the slave nodes;
   generating a coupled model that includes at least a portion of the multi-body model and at least a portion of the partial vehicle finite element model; and
   running at least one impact simulation with the coupled model to thereby identify the effects of the impact on at least one of the vehicle and the occupant of the vehicle.

15. A method of simulating a vehicle impact comprising the steps of:
   generating a first finite element model of the vehicle, wherein the first finite element model includes a plurality of boundary points on the vehicle;
   running at least one vehicle impact simulation on the first finite element model to generate impact data at each of the boundary points of the first finite element model;
   generating a multi-body model that includes a vehicle occupant and at least one vehicle component, wherein the multi-body model includes a plurality of boundary points that coincide with the boundary points included in the first finite element model;
   running at least one vehicle impact simulation on the multi-body model by inputting impact data generated at each of the boundary points of the first finite element model into the boundary points of the multi-body model;
   generating a partial vehicle finite element model that includes a plurality of master nodes and a plurality of slave nodes, wherein baundary conditions input at the master nodes generates output data at the slave nodes;
   generating a coupled model that includes at least a portion of the multi-body model and at least a portion of the partial vehicle finite element model such that the coupled model includes a steering wheel from the multi-body model and redundantly includes a steering wheel from the partial vehicle model; and
   running at least one impact simulation with the coupled model to thereby identify the effects of the impact on at least one of the vehicle and the occupant of the vehicle.

* * * * *